US008410780B2

(12) United States Patent
Cochrane et al.

(10) Patent No.: US 8,410,780 B2
(45) Date of Patent: Apr. 2, 2013

(54) ADAPTIVE SIGNAL AVERAGING METHOD WHICH ENHANCES THE SENSITIVITY OF CONTINUOUS WAVE MAGNETIC RESONANCE AND OTHER ANALYTICAL MEASUREMENTS

(75) Inventors: Corey Cochrane, Culver City, CA (US); Patrick M. Lenahan, Boalsburg, PA (US)

(73) Assignee: The Penn State Research Foundation, University Park, PA (US)

( * ) Notice: Subject to any disclaimer, the term of this patent is extended or adjusted under 35 U.S.C. 154(b) by 19 days.

(21) Appl. No.: 12/557,123

(22) Filed: Sep. 10, 2009

(65) Prior Publication Data

US 2010/0066366 A1 Mar. 18, 2010

Related U.S. Application Data

(60) Provisional application No. 61/096,449, filed on Sep. 12, 2008.

(51) Int. Cl.
*G01V 3/00* (2006.01)
*G01R 33/44* (2006.01)
*A61B 5/055* (2006.01)

(52) U.S. Cl. ........ 324/310; 324/312; 324/314; 600/410; 600/425

(58) Field of Classification Search .......... 324/300–322; 600/410–435; 382/128–131, 100; 702/189, 702/56, 304, 199; 342/25 A, 25 F; 250/458.1; 235/494; 89/1.11
See application file for complete search history.

(56) References Cited

U.S. PATENT DOCUMENTS

| | | | | |
|---|---|---|---|---|
| 3,376,499 | A * | 4/1968 | Freeman | 324/312 |
| 3,478,328 | A * | 11/1969 | Schillinger | 702/199 |
| 4,720,679 | A * | 1/1988 | Patrick et al. | 324/309 |
| 5,020,411 | A * | 6/1991 | Rowan | 89/1.11 |
| 5,838,599 | A * | 11/1998 | Tao et al. | 708/304 |
| 6,400,826 | B1 * | 6/2002 | Chen et al. | 382/100 |
| 6,549,858 | B1 * | 4/2003 | Shelley et al. | 702/56 |
| 6,891,371 | B1 * | 5/2005 | Frigo et al. | 324/307 |
| 6,915,240 | B2 * | 7/2005 | Rabinowitz et al. | 702/189 |
| 7,234,645 | B2 * | 6/2007 | Silverbrook et al. | 235/494 |
| 7,282,723 | B2 * | 10/2007 | Schomacker et al. | 250/458.1 |
| 7,309,867 | B2 * | 12/2007 | Costa et al. | 250/458.1 |
| 8,193,967 | B2 * | 6/2012 | Nguyen et al. | 342/25 F |
| 2003/0101026 | A1 * | 5/2003 | Rabinowitz et al. | 702/189 |
| 2007/0247153 | A1 * | 10/2007 | Yu et al. | 324/307 |
| 2008/0012566 | A1 * | 1/2008 | Pineda et al. | 324/309 |
| 2010/0066366 | A1 * | 3/2010 | Cochrane et al. | 324/310 |
| 2011/0012778 | A1 * | 1/2011 | Nguyen et al. | 342/25 A |

(Continued)

OTHER PUBLICATIONS

Campbell, Jason P. et al., Atomic-Scale Defects Involved in the Negative-Bias Temperature Instability, IEEE Transactions on Device and Materials Reliability, vol. 7, No. 4, Dec. 2007.

(Continued)

*Primary Examiner* — Melissa Koval
*Assistant Examiner* — Tiffany Fetzner
(74) *Attorney, Agent, or Firm* — Buchanan Ingersoll & Rooney PC (57) ABSTRACT

This method of adaptive signal averaging is used to enhance the signal to noise ratio of magnetic resonance and other analytical measurements which involve repeatable signals partially or completely obscured by noise in a single measurement at a rate much faster than that observed with conventional signal averaging. This technique expedites the signal averaging process because it filters each individual scan in real time with an adaptive algorithm and then averages them separately to provide an averaged filtered signal with less noise. This technique is particularly useful for any type of continuous wave magnetic resonance experiment or any other noisy measurement where signal averaging is utilized.

12 Claims, 3 Drawing Sheets

U.S. PATENT DOCUMENTS

2011/0163912 A1* 7/2011 Ranney et al. ............... 342/25 F

OTHER PUBLICATIONS

Lepine, Daniel J., Spin-Dependent Recombination on Silicon Surface, Physical Review B, vol. 6, No. 2, Jul. 15, 1972.

Petrova, Pesha D. et al., Synthesis and Simulation of Binary Code Converters, Telsiks 2003, Serbia and Montenegro, Nis, Oct. 1-3, 2003.

Cochrane, C.J. et al., Deep Level Defects Which Limit Current Gain in 4H SiC Bipolar Junction Transistors, Applied Physics Letters 90, 123501 (2007).

Verhaegen, M.H., Round-Off Error Propagation in Four Generally-Applicable, Recursive, Least-Squares Estimation Schemes, Automatica, vol. 25, No. 3, pp. 437-444, 1989.

Kaplan, D. et al., Explanation of the Large Spin-Dependent Recombination Effect in Semiconductors, Journal de Physique—Letters, No. 39, Feb. 15, 1978.

Pajevic, Sinisa et al., Use of the Adaptive Line Enhancement Filter for SNR Improvement in NMR Spectroscopy, IEEE Transactions on Signal Processing, vol. 42, No. 12, Dec. 1994.

Moustakides, George V., Study of the Transient Phase of the Forgetting Factor RLS, IEEE Transactions on Signal Processing, vol. 45, No. 10, Oct. 1997.

Yang, Bin, A Note on the Error Propagation Analysis of Recursive Least Squares Algorithms, IEEE Transactions on Signal Processing, vol. 42, No. 12, Dec. 1994.

* cited by examiner

ADAPTIVE SIGNAL AVERAGING METHOD WHICH ENHANCES THE SENSITIVITY OF CONTINUOUS WAVE MAGNETIC RESONANCE AND OTHER ANALYTICAL MEASUREMENTS

GOVERNMENT SPONSORSHIP

This invention was made with government support under Contract No. W911NF-06-2-0051, awarded by the Army/ARO. The Government has certain rights in the invention.

FIELD OF INVENTION

The invention relates to signal processing techniques.

BACKGROUND OF THE INVENTION

Magnetic resonance is an immensely useful analytical technique that can be applied to electrons, to nuclei, or sometimes, both simultaneously. Electron spin resonance (ESR) a technique which is also sometimes referred to as electron paramagnetic resonance (EPR) and its nuclear analog, nuclear magnetic resonance (NMR) are among the most powerful and widely utilized analytical tools of the past sixty years for applications in medicine, chemistry, biology, solid state electronics, archaeology, and many other fields, far too numerous to list.

ESR is applied in areas which are as mundane as evaluating the shelf life of beer and to areas as exotic as estimating the age of exceptionally ancient artifacts. ESR is utilized in the pharmaceutical industry to study the way certain drugs attack disease and can be utilized to understand the nature of disease at a fundamental molecular scale. An example of an ailment under study via ESR is mad cow disease. ESR is used in the electronics industry to understand fundamental materials based limitations in the performance of integrated circuits. ESR, in the form of electrically detected magnetic resonance (EDMR), may have great potential in the future in quantum computing.

Briefly, in electron spin resonance and in other types of magnetic resonance, energy is absorbed by a spin (that of an electron in ESR and a nucleus in NMR) when a particular relationship exists between a large applied magnetic field vector, the spin center under observation, and the frequency of electromagnetic radiation (radio frequency or microwave frequency) applied to the sample under observation. The relationship conveys a great deal of information about the physical and chemical nature of the spin's atomic surroundings. Depending upon the specific application, this information can help evaluate the potential of a drug in the treatment of disease or identify physical imperfections that limit the performance of integrated circuits, or determine the age of an ancient artifact. Many applications are possible.

Nearly all scientific measurements involve some sort of electrical signal which encodes useful information. These electrical signals consist of a component which carries the physical, chemical, or biological information of interest and a noise component. Noise is the undesirable component of the total signal. The ratio of signal to noise is a generally a meaningful measure of the quality of the scientific measurement. If the signal to noise ratio falls below a certain value, the measurement becomes meaningless. The signal to noise ratio is typically a function of the time involved in making the measurement. When the noise is random in nature, which is often the case, the signal to noise ratio can be improved by increasing the time involved in measurement. This is often done by signal averaging, that is, repeating a (repeatable) measurement over and over, then averaging the measurements. In conventional signal averaging, the signal to noise ratio improves as the square root of the number of repetitions.

EDMR typically involves spin dependent recombination (SDR). EDMR in general and SDR in particular are electron spin resonance (ESR) techniques in which a spin dependent change in current provides a very sensitive measurement of paramagnetic defects. Without special application of digital signal processing techniques, EDMR measurements involving SDR are about 7 orders of magnitude more sensitive than conventional ESR. The techniques are therefore particularly useful in studies of imperfections in the semiconductor devices utilized in integrated circuits. In such devices, the dimensions are quite small and can have very low defect densities. SDR detected EDMR can be utilized in fully processed devices such as metal oxide semiconductor field effect transistors (MOSFETs), bipolar junction transistors (BJTs), and diodes. With some additional improvements, the technique's very high sensitivity may make it potentially useful for single spin detection and quantum computing. However, the sensitivity EDMR is not currently high enough to detect a single spin in the presence of the noise encountered with present day EDMR spectrometers in a reasonable amount of time.

Continuous wave magnetic resonance typically utilizes a sinusoidal modulation of the applied magnetic field, thereby encoding the signal in a sinusoid. The amplitude of the modulated signal is a measure of the magnetic resonance signal, in this case, an EDMR detected ESR signal. ESR measurements in general and, in the specific case utilized herein, EDMR, can provide a measure of the number of paramagnetic defects within the sample under study as well as the means to identify the physical nature of these defects. Magnetic resonance in general can provide a very broad range information about physical and chemical structure. In continuous wave magnetic resonance, a lock-in amplifier (LIA) is generally utilized to demodulate the amplitude modulated magnetic resonance signal to DC, thus exploiting the sensitivity enhancement available from the phase and frequency detection. This widely used method effectively attenuates much of the noise in the magnetic resonance measurement. In the specific EDMR detected ESR example utilized here, much of the noise is associated with the 1/f noise typically observed with a DC current produced by the transistor.

Although lock-in detection is quite powerful, it is often insufficient to achieve a reasonable signal-to-noise ratio (SNR), so signal averaging is also often utilized in magnetic resonance. In cases in which the single measurement SNR is particularly low, extensive signal averaging may be required to glean useful information from the magnetic resonance measurements. In our demonstration we utilize ESR spectra detected through EDMR in transistors.

Though work has been performed to remove noise observed in related fields via software such as nuclear magnetic resonance (NMR), not much has been done in any area of ESR including EDMR.

SUMMARY OF THE INVENTION

We provide a particularly useful signal processing technique which reduces the noise in all types of continuous wave magnetic resonance, including EDMR. In addition, the technique can also be used in other experiments where repetitive measurements are made. In this technique, we filter each magnetic resonance scan in real time (EDMR detected ESR in one case) with an adaptive filtering algorithm to provide a filtered output for each scan. These filtered outputs are separately averaged to obtain an averaged filtered output. This updated conventional average can be regressively used by the adaptive algorithm to continually filter the incoming magnetic resonance scans. It is precisely this filtered average which has much less noise to that of the conventional average due to the reduction of noise in each of the individual filtered scans.

The method quite significantly improves the rate of data acquisition or, essentially equivalently, the signal to noise ratio of magnetic resonance and other analytical measurements. We directly demonstrate the power of the method by applying it to continuous wave magnetic resonance measurements utilizing one particularly sensitive magnetic resonance method.

We here disclose a method which greatly improves upon this standard method of enhancing signal to noise ratios.

We have demonstrated our invention with one specific type of continuous wave magnetic resonance, electrically detected magnetic resonance (EDMR). Although our discussion and our demonstration of the invention both directly involve EDMR, the invention is equally applicable to all types of continuous wave magnetic resonance: ESR (also known as EPR), NMR, Electron Nuclear Double Resonance (ENDOR), and other magnetic resonance techniques. The technique is in fact applicable to all types of analytical measurements in which the ability to acquire a repeatable measurement involving a current or a voltage is limited by insufficient signal to noise ratios. (It should thus also be applicable to pulsed magnetic resonance measurements.) We demonstrate our invention with sensitive EDMR detected ESR measurements in small devices with relatively low defect densities. These EDMR measurements are of this type; they involve repeatable measurements which are limited by low signal to noise ratios.

EDMR measurements in small devices provides an excellent system in which to demonstrate the capabilities of our invention, which we show can greatly reduce data acquisition time and enhance signal to noise ratio.

This filter can be applied to virtually any noisy measurement to improve signal to noise ratio. This has practical application in any situation where a noise containing signal is indicative of a physical or chemical condition, is produced by some measuring device and results from repeat measurement being taken to generate multiple signals or scans.

The technique is performed using a standard personal computer which is capable of receiving multiple time sampled signals through an external analog to digital converter. The software that is used is required to be able to analyze, manipulate, and store signals. Also, just about any adaptive algorithm can be used. We choose to use the exponentially weighted recursive least squares algorithm (EWRLS) because of its superior performance relative to others. This algorithm is described below.

Other features and advantages of our method will become apparent from a more detailed description of the technique and through data presented in the drawings.

DESCRIPTION OF THE PREFERRED EMBODIMENTS

We provide a real time exponentially weighted recursive least squares adaptive signal averaging technique which greatly decreases the amount of time needed for signal averaging of continuous wave magnetic resonance measurements. The technique provides a very low cost means to achieve a quite significant improvement in signal to noise ratio and data acquisition time. We demonstrate the utility of the technique with very sensitive ESR measurements using electrically detected magnetic resonance (EDMR) via spin dependent recombination (SDR) in individual transistors. However, we emphasize that the invention should be widely applicable in continuous wave magnetic resonance measurements. In addition, the method should be useful in enhancing any analytical measurement in which a repeatable signal is partly or completely obscured by noise in a single measurement.

We performed our measurements demonstrating the invention on 4H SiC lateral n-channel MOSFETs. These devices had a gate area of 200×200 $\mu m^2$ and a thickness of 500 Å. These devices received a thermal ONO gate growth process. All EDMR detected ESR measurements were made with the sample at room temperature and were performed with a fixed gate voltage. All EDMR spectra reported here were taken with the magnetic field orientation parallel to the (100) Si/dielectric surface normal. EDMR measurements were made with a modulation frequency of 1400 Hz and quite low modulation field amplitude (<0.1 Gauss). The EDMR measurements were made on a custom built EDMR spectrometer which utilizes a Resonance Instruments 8330 X-band bridge, $TE_{102}$ cavity, and magnetic field controller, a Varian E-line century 4 inch magnet, and power supply. We use a Stanford Research Systems SR570 current preamplifier to prefilter and amplify the device currents. We have implemented a virtual lock-in amplifier using Labview (version 8.2) with the NI PCI 6259 M series DAQ card. This VLIA is just as good, if not better, than any of the off the shelf commercial lock-in amplifiers. All software is implemented in Labview and is run on a Dell Optiplex GX270 desktop computer with a 3.2 GHz processor and 1 GB of RAM.

Some of the noise sources that are associated with our EDMR detected ESR measurements include the ambient noise from the surrounding hardware and, most importantly, the internal shot, thermal, and flicker noise arising from within the device under observation.

Figure 1:
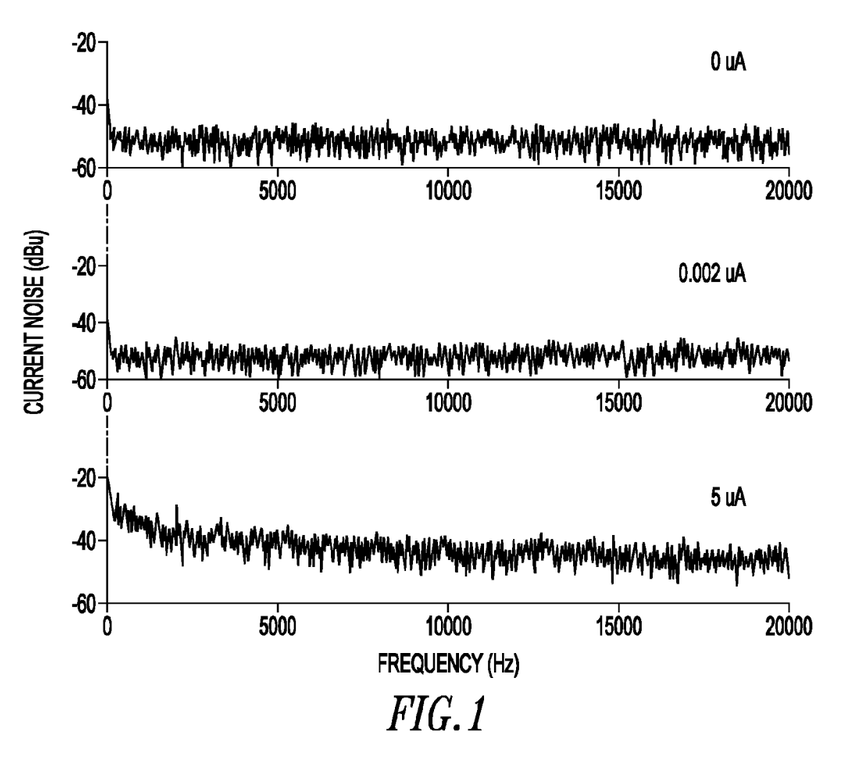
FIG. 1 is a current noise spectra from a 4H SiC MOSFET configured in a gated controlled diode biased with three different voltages.

FIG. 1 illustrates the current noise spectra from a MOSFETs configured in a gated controlled diode for three different biasing conditions. The top plot represents the condition where 0 volts was applied to the source and drain of the MOSFET which indicates that spectra observed is the noise that is generated by the preamp. Note that this is more or less a white spectrum, meaning that the noise variance at all frequencies is the same. The middle plot represents the condition where the source and drain of the MOSFET were applied a small forward bias yielding a dc current of 0.002 µA and the bottom plot illustrates the condition where the source and drain were applied a large forward bias yielding a dc current of 5 μA. The latter configuration corresponds to the biasing condition that results in maximum recombination and the operating point of our EDMR experiments. Note that it is this spectrum is significantly different than the other two. The reason for this is because of the significant flicker and shot noise that is introduced with larger dc currents. This indicates that the dominating source of noise in the EDMR detected ESR measurement is due to flicker and shot noise, that is, noise coming from the sample under measurement, and that the noise from the preamp only becomes a problem when smaller devices (smaller currents) are being used.

Initially, we attempted to reduce the noise observed in the EMDR experiments with adaptive noise cancellation techniques with a field programmable gate array (FPGA) before lock-in detection. The logic of processing EDMR signals before lock-in detection was in hopes that a better representation (ie: improved SNR) of the amplitude modulated input signal would result in an improved SNR signal at the output of the LIA. It turned out that only minimal improvement was achieved because, as mentioned earlier, the majority of the noise in the EDMR experiment arise from the device under study and not the surrounding ambient noise. Also, lock-in detection itself is an extremely effective means of removing noise because it is not only frequency sensitive, but it is sensitive to phase as well. Therefore, the only noise that contaminates the EDMR signal is the noise that has frequency content near that of the modulation frequency. As a result, we decided to move our search to the output of the LIA for an effective way to enhance the sensitivity of EDMR. This LIA output signal is a time varying voltage. In most ESR measurements, including our EDMR detected ESR measurements, the time variation corresponds to variation in an applied magnetic field.

Figure 2:
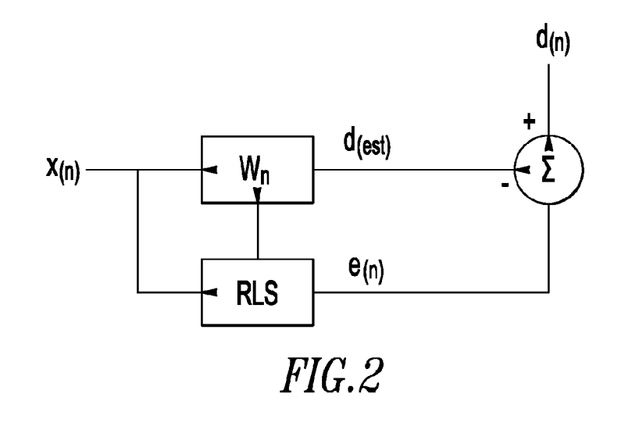
FIG. 2 is a block diagram of the adaptive linear prediction.

In some cases, the devices under study have very few defects which make signal acquisition very difficult and time consuming. These devices provided the opportunity to clearly demonstrate the power of the method: a way to expedite the averaging process by utilizing the predictability of the autoregressive noise features at the output of the LIA. The time constant of the LIA determines the correlation between successive samples and hence, the predictability. We term this tool an adaptive signal averager (ASA) which utilizes adaptive linear prediction as illustrated in FIG. 2. It works by using the conventional scan average as the desired response in an adaptive linear prediction configuration. The linear predictor $w_n$ is a finite impulse response (FIR) filter of length p and the input to the linear predictor is the tapped delayed noisy EDMR signal x(n).

$$w_n = [w_n(1), w_n(2), \ldots, w_n(p)]^T \qquad (1)$$

$$x(n) = [x(n-1), x(n-2), \ldots, x(n-p)]^T \qquad (2)$$

The prediction or estimate $d_{est}(n)$ of the desired signal is simply computed by the inner product of these two vectors.

$$d_{est}(n) = x^T(n) w_n \qquad (3)$$

The estimate is then subtracted from the scan average to form an instantaneous error e(n) which is used in an algorithm to update the weights of the FIR predictor.

$$e(n) = d(n) - d_{est}(n) \qquad (4)$$

There are many forms of adaptive filters but the two most widely used and efficient are the least mean squares (LMS) and recursive least squares (RLS) adaptive filters. These filters are advantageous because they are capable of tracking non-stationary signals and noise and neither algorithm requires an estimate of the signal or noise statistics. This is desired for virtually all continuous wave magnetic resonance experiments because these statistics vary from sample to sample and may vary over time, over temperature, over many possible variables possible in the measurements. This variability in measurement is the case in the EDMR measurements utilized in demonstrating our method. The main advantage of the RLS algorithm has over the LMS algorithm is that it has about an order of magnitude faster convergence time, though, in most cases, the LMS algorithm is known to have better tracking performance. Although many adaptive filter algorithms have been developed and many could be utilized in our discussion, we choose one, the one which is likely the most advantageous, the RLS algorithm. However it is our intent in this patent disclosure to include ALL adaptive algorithms. To increase the tracking performance of the RLS algorithm, we utilized the exponentially weighted RLS (EWRLS) algorithm by incorporating an exponentially weighing factor λ into the system. By doing this, the algorithm effectively becomes more sensitive to changes in the noise environment. The exponential weighting factor λ controls the memory of the system and is chosen to be in the range 0<λ<1. The EWRLS algorithm becomes the RLS algorithm when λ is chosen to be 1 which provides the system with infinite memory.

The EWRLS algorithm attempts to minimize the exponentially weighted sum of squared errors cost function which is given by equation (5).

$$\xi(n) = \sum_{i=0}^{n} \lambda^{n-i} |e(n)|^2 \qquad (5)$$

In order to minimize this cost function, the gradient is taken with respect to the weights of the FIR predictor and set equal to zero which is given by equation (6).

$$\nabla \xi(n) = -\sum_{i=0}^{n} \lambda^{n-i} x(i) e(i) = 0 \qquad (6)$$

This resultant vector represents the direction of steepest decent on the sum of squared error surface. Plugging in for the error and rearranging yields the set of linear equations given in equation (7).

$$\left[ \sum_{i=0}^{n} \lambda^{n-i} x(i) x^T(i) \right] w_n = \sum_{i=0}^{n} \lambda^{n-i} d(i) x(i) \qquad (7)$$

This result can be simplified by realizing that the terms in the brackets on the left is the summation of exponentially weighted deterministic autocorrelation matrices $R_x(n)$ of the input signal from time index 0<i<n and the right hand side is the summation of exponentially weighted deterministic cross correlation vectors $r_{dx}(n)$ of the desired signal and the input signal from time index 0<i<n. By this realization, equation (7) in matrix form is equivalent to equation (8).

$$R_x(n) w_n = r_{dx}(n) \qquad (8)$$

Therefore, the weight vector $w_n$ is found by multiplying the cross correlation vector $r_{dx}(n)$ with the inverse correlation matrix $R_x^{-1}(n)$. Calculation of this inverse is computationally intense so it is not desirable to calculate it every time a new sample is presented to the system. Therefore, one way to reduce the computational time is to realize that $R_x(n)$ and $R_x^{-1}(n)$ can be solved recursively. It can be easily shown that, $$R_x(n) = \lambda R_x(n-1) + x(n)x^T(n) \quad (9)$$

Now that $R_x(n)$ can be solved for in terms of $R_x(n-1)$, there needs to be a way to compute the inverse of this matrix. This is called the matrix inversion lemma. The inverse of the exponentially weighted autocorrelation matrix in equation (9) can be solved using Woodbury's identity. Woodbury's identity states that matrix A of equation (10) can be inverted with the relation shown in equation (11). This identity only holds if A and B are positive-definite p-by-p matrices, D is a positive-definite n-by-p matrix, and C is an p-by-n matrix. The relation is easily shown by computing $AA^{-1} = I$, where I is the identity matrix.

$$A = B^{-1} + CD^{-1}C^T \quad (10)$$

$$A^{-1} = B - BC(D + C^T BC)^{-1} C^T B \quad (11)$$

Note that the following derivation is for real valued data. The transpose operations would be replaced with the hermitian operator for imaginary valued data. Comparing equations (10) and (11), it can be realized that $$A = R_x(n) \quad (12)$$

$$B^{-1} = \lambda R_x(n-1) \quad (13)$$

$$C = x(n) \quad (14)$$

$$D = 1 \quad (15)$$

Then, plugging equations (12)-(15) into equation (11), the exponentially weighted inverse autocorrelation matrix can be computed recursively as follows.

$$R_x^{-1}(n) = \lambda^{-1} R_x^{-1}(n-1) + \frac{\lambda^{-2} R_x^{-1}(n-1) x(n) x^T(n) R_x^{-1}(n-1)}{1 + \lambda^{-1} x^T(n) R_x^{-1}(n-1) x(n)} \quad (16)$$

This equation is usually reduced into simpler form, as shown in equation (17)

$$R_x^{-1}(n) = \frac{1}{\lambda}[R_x^{-1}(n-1) - g(n)z^T + (n)] \quad (17)$$

where, $$z(n) = R_x^{-1}(n-1)x(n) \quad (18)$$

$$g(n) = \frac{1}{\lambda + x^T(n)z(n)} z(n) = R_x^{-1}(n)x(n) \quad (19)$$

The next step is to solve for the weight update. As stated earlier, the weight vector is found by multiplying the cross correlation vector $r_{dx}(n)$ with the inverse correlation matrix $R_x^{-1}(n)$. To reduce computation, $r_{dx}(n)$ is solved recursively in a similar fashion to that of $R_x(n)$ and is shown below.

$$r_{dx}(n) = \lambda r_{dx}(n-1) + d(n)x(n) \quad (20)$$

The weight vector is found by computing the product of the autocorrelation matrix $R_x^{-1}(n)$ obtained in equation (16) and the recursive cross correlation vector $r_{dx}(n)$ formed by equation (21) and realizing that $R_x^{-1}(n-1)w_{n-1} = r_{dx}(n-1)$.

$$w_n = R_x^{-1}(n)r_{dx}(n) = w_{n-1} + g(n)\alpha(n) \quad (21)$$

where g(n) was defined previously and α(n) is the a priori error. The priori error is the error that occurs when using the previous set of filter coefficients $w_n$ and is shown below, $$\alpha(n) = d(n) - x^T(n)w_{n-1} \quad (22)$$

It is easy to see that the computation has been reduced significantly from the conventional LS algorithm because of the recursive nature of the autocorrelation and cross correlation functions. $R_x^{-1}(n)$ can be initialized directly or by forming the matrix δ·I, where δ is a constant called the regularization parameter and I is the identity matrix. The initialization of δ depends on the SNR of the signal under observation and should be calculated with the following equation:

$$\delta = \sigma_u^2(1-\lambda)^\alpha \quad (23)$$

where $\sigma_u^2$ represents the noise variance of an individual EDMR scan, λ is the exponential weighting factor, and α is a constant to be determined by the SNR of the EDMR scan. α should be chosen to be 1 for SNR>30 dB, −1<α<0 for SNR~10 dB, α<−1 for SNR<−10 dB.

In some cases, the RLS algorithm can become unstable due to its mathematical formulation. This occurs when the inverse autocorrelation matrix loses its symmetry property. This can be avoided simply by calculating the lower (or upper) triangle of the inverse autocorrelation matrix and filling the upper (or lower) triangle to preserve its symmetry property. Not only is this technique attractive because it prevents instability, but it also reduces computation. We utilized this method because we initially encountered instability problems.

As mentioned earlier, the ASA filters each incoming EDMR scan in real time via the EWRLS algorithm. The conventional average is used as the desired signal in the algorithm and can be thought of as an approximate guide for the filter to follow. Therefore, the filter allows the noise that it sees to pass, but it effectively reduces the variance of it, thereby acting as a low pass filter with a time constant proportional to $(1-\lambda)^{-1}$. This is ideal for magnetic resonance measurements, because one usually sacrifices a smaller time constant for the observation of smaller signals. As a result, each individual spectrum will contain more noise and will require the need for longer signal averaging to obtain a reasonable SNR. The filtered output scans are then averaged separately. The underlying idea for this action is that, because the noise of the filtered scans is reduced, the noise in the filtered average will be reduced faster than that of the noise in the conventional average.

In conventional signal averaging, assuming the noise has a Gaussian distribution and is independent and identically distributed (iid) with variance $\sigma_u^2$, the averaged noise variance $\sigma_{uN}^2$ is reduced by a factor of the number of scans N in the average as given in equation (14).

$$\sigma_{uN}^2 = \frac{\sigma_u^2}{N} \quad (24)$$

The reduction in noise of the ASA can be determined by analyzing the error that is introduced into the algorithm. For an individual scan, the error introduced into the system by the filter is the combination of the averaged noise in the conventional average $u_N(n)$ with variance $\sigma_{uN}^2$, and the prediction error of the filter v(n).

$$e(n) = d(n) - d_{est}(n) = [d(n) + u_N(n)] - [d(n) + v(n)] = U_N(n) - v(n) \quad (25)$$

For ease of analysis, it is assumed that the prediction error is also Gaussian random variable and has 0 mean and variance $\sigma_v^2$. Therefore, the variance of the error $\sigma_e^2$ for an individual scan is found by adding the variances of each of the random variables.

$$\sigma_e^2 = \sigma_{uN}^2 + \sigma_v^2 = \frac{\sigma_u^2}{N} + \sigma_v^2 \qquad (26)$$

If M filtered scans are averaged, then the reduction in noise variance achieved by the ASA is simply given in equation (17).

$$\sigma_{e_M}^2 = \frac{\sigma_u^2}{NM} + \frac{\sigma_v^2}{M} \qquad (27)$$

where M<N. The reason M scans are averaged and not N is because we want the conventional average to build up a reasonable desired response before the filter is applied so a better prediction can be achieved. N is not that much greater than M so they approximately equal when considering longer averages. Therefore, as N and M get larger, the faster the first term in equation (27) dies away which implies that the dominating source of noise will eventually only be due to the prediction error of the filter. This is desirable because it is this first term that actually slightly biases the ASA. By allowing the conventional average to build a reasonable desired signal before the filter is applied, the noise bias is gradually removed. It turns out that not many scans are required to be averaged for this bias to be removed.

As discussed earlier, the prediction of the desired signal is always better than or equal to that of the noisy input because the filter is optimized to minimize the sum of squared errors. Therefore, the reduction in noise of the filtered average will always be better than that of the original average over time, despite being averaged with fewer scans. As a result, one can see why this averaging process is expedited; averaging a random variable with a small variance (prediction error) will converge much faster than averaging a random variable with larger variance (noise error).

Figure 3:
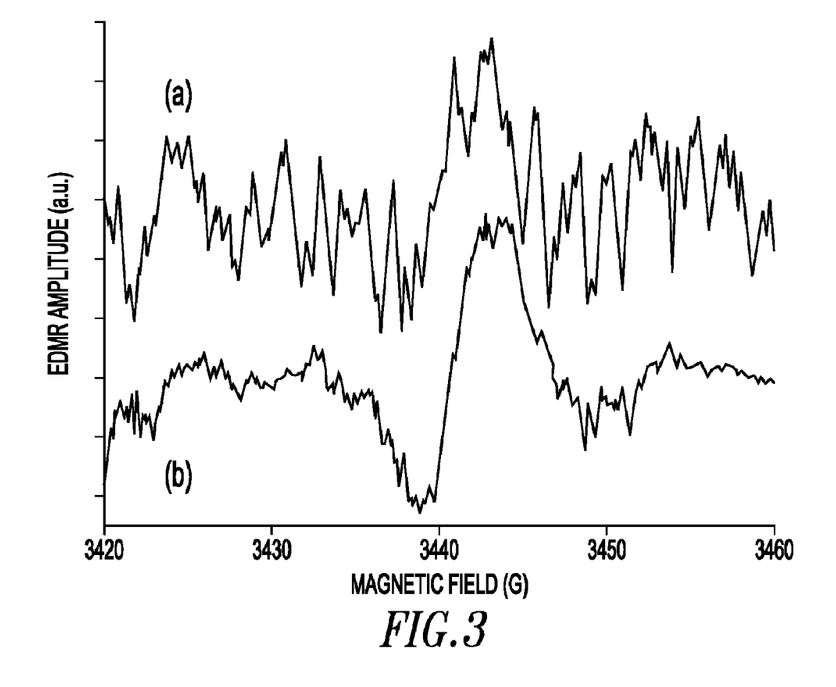
FIG. 3 is a graph showing EDMR amplitude as the magnetic field increases of individual unfiltered scan (a) compared to the individual filtered scan (b).
Figure 4:
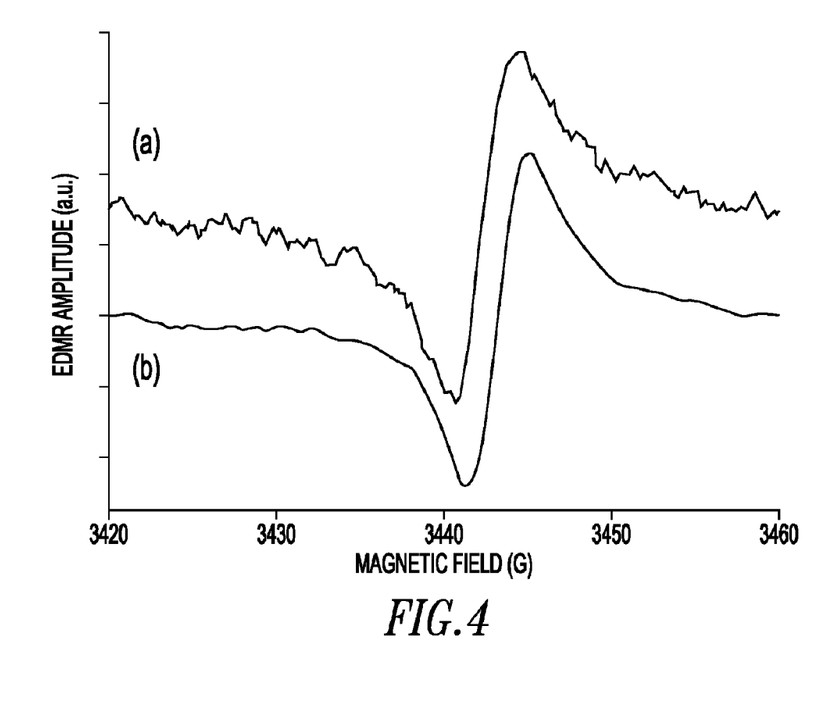
FIG. 4 is a graph similar to FIG. 3 showing an average of 100 unfiltered scans (a) compared to the average of 85 filtered scans (b).
Figure 5:
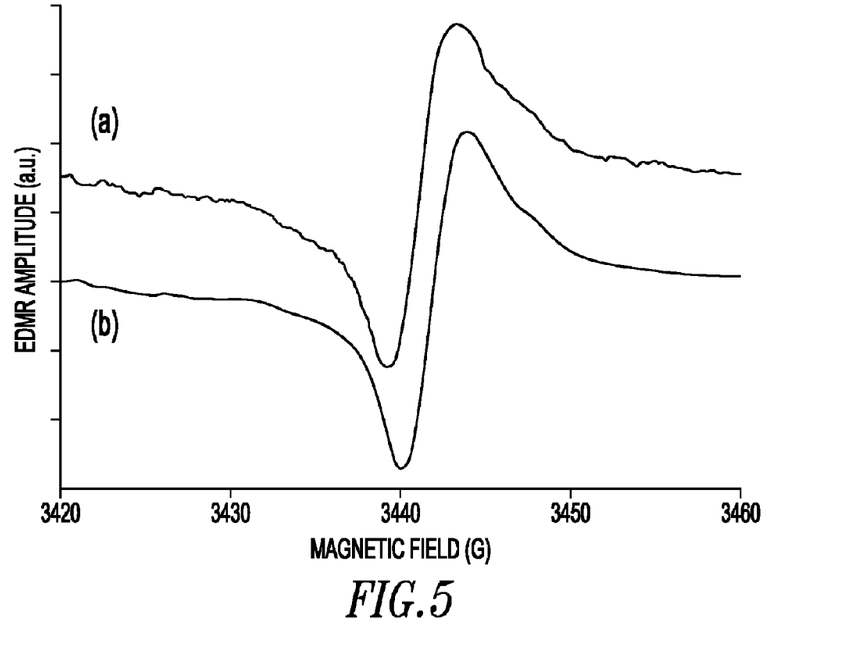
FIG. 5 is a graph similar to FIGS. 3 and 4 showing an average of 1000 unfiltered scans (a) compared to the average of 985 filtered scans (b).
Figure 6:
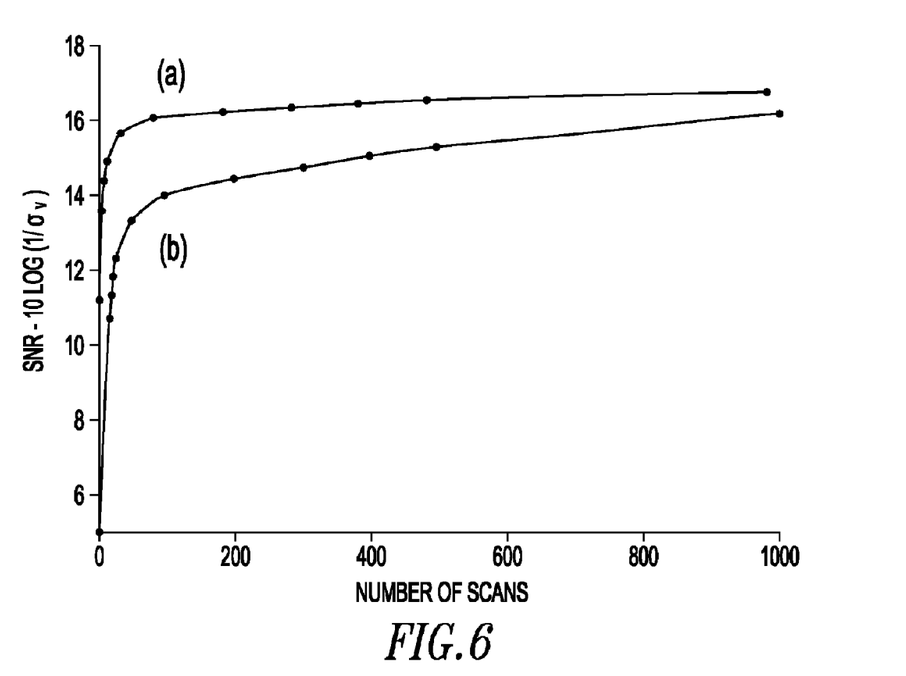
FIG. 6 is a graph showing the signal-to-noise ratio (SNR) as the number of scans increases for both the conventional (a) and filtered (b) averages.

The EWRLS ASA was implemented in Labview version 8.2 software and applied to EDMR detected ESR for 4H SiC MOSFETs. The spectrometer settings used in the scan were purposely chosen to reduce the SNR of the signal so to better visually observe the improvement of the filtered signal. The variables that were used in the EWRLS algorithm were $\lambda=0.98$, $\delta=1$, p=32 taps, and the filter was applied after averaging 15 scans. FIG. 3 compares the performance of the filter of an individual scan. With the signal amplitude normalize to 1, the noise variance was calculated to be $\sigma_u^2=0.0315$ in the unfiltered trace and was calculated to be $\sigma_u^2=0.00278$ for the filtered trace. (These values were calculated by taking the variance of the difference between the individual scan and the final average.) As a result, a 11.3 times reduction in noise variance was observed in a single scan which corresponds to a 11.3 times reduction in time as well. FIG. 4 compares the average of 100 unfiltered scans and the average of 85 filtered scans. Note that the filtered average isn't as noisy as the conventional average and has almost converged to its final value. FIG. 5 compares the average of 1000 unfiltered scans and the average of 985 filtered scans. Note that noise is present in the unfiltered average whereas the noise is not visually observable in the filtered average. Also, the variance of the noise that remains in the conventional average after 1000 scans is approximately equal to the noise variance in the filtered average after about 90 or so scans as illustrated in FIG. 6. As a result, the reduction in a noise variance by factor of 11.3 in an individual scan is equivalent to a reduction in time by the same amount as illustrated in FIG. 6. In this particular experiment, the conventional average (1000 scans at 1 minute each) took 1000 minutes to complete. The filtered average converged in approximately 90 scans which amounts to 910 less minutes of scanning time to obtain a comparable SNR. This is a very significant consideration, especially for measurements that require days of signal averaging. A signal that would usually require 10 days of signal averaging would be reduced to averaging for less than 1 day (assuming similar filter performance).

A concern one might have would be when to apply the filter. It turns out, that even if the SNR is less than 1, the filtered average will converge to the same result as the original average. This is acceptable to do so long as a sufficient number of scans are averaged first before the filter is applied to remove much of the noise bias, as discussed earlier. We applied the ASA to a 4H SiC BJT which has smaller amplitude hyperfine structure that is unobservable until at least 20 or so scans in the average. The filter was applied after 15 scans (before any of the small hyperfine structure was observed) and our results show that the unfiltered average and the filtered average are identical after 250 scans. The only difference is that the filtered average converged in many fewer scans.

We have demonstrated that the EWRLS ASA is an extremely useful and efficient tool for enhancing the rate of data acquisition and the signal to noise ratios for continuous wave magnetic resonance through our demonstrations utilizing EDMR detected ESR. We have shown that the EWRLS ASA method is capable of reducing the noise variance by a factor of 11.3 in a magnetic resonance trace and, as expected, the average of the filtered scans was shown to converge by a similar factor. Our method can be used in any situation in which a set of noise-containing signals is generated through measurements repeated over and over again and then these signals are averaged. The requirement is only that the signal under study, which may be largely or completely obscured by noise in a single trace, is repeatable. It should be emphasized that, although our demonstration utilizes one specific continuous wave magnetic resonance technique, EDMR, the approach is quite widely applicable to other measurements: essentially any type of continuous wave ESR measurement and other analytical measurements in which repeatable (somewhat to very noisy) signals are encountered. Thus, in addition to the specific variety of magnetic resonance measurements utilized in the demonstration, continuous wave EDMR, the method can be used for other measurements including MRI scans. This filter is even successful when the SNR of an EDMR scan is less than 1. With such great reduction in noise, the ASA effectively expedites the time of averaging.

Depending upon the circumstances involved in the application of our method, it may be utilized in many ways which, at the very least, would save a great deal of time and cost and, at most, could significantly enhance the power of important analytical tools such as continuous wave magnetic resonance. This filter can also be applied to any measurement in which a repeatable measurement is available and in which extremely high sensitivity and relatively short acquisition times are required. A few, among many, possible applications of this invention include quite significant improvement in measurements which can determine the structure and density of performance limiting or performance enhancing point defects present in a semiconductor or insulator materials and devices, identifying biologically/medically important free radicals present in tissue, provide information with regard to the surroundings of selected molecules/free radicals in inorganic and organic materials, including biological materials. This method may also be very useful in quantum computing experiments where weeks of signal averaging may currently be required for near single spin detection sensitivity.

One could envision utilization of the invention in biomedical applications in which the far more rapid data acquisition which the technique provides may aid a physician in the treatment of illness or at least reduce the time a patient is subjected to an unpleasant diagnostic experience. A reduction of a factor of ten in the amount of time spent in an unpleasant diagnostic experience would have great value to the patient. Since the method greatly decreases the amount of time required for data acquisition, it would, for example, greatly increase the productivity of measurements involving very sensitive measurements requiring significant signal averaging. One could envision, for example, making sensitive measurements of a relatively short lived free radical possible, whereas such measurements are now not possible, by decreasing the required data acquisition time by better than a factor of ten. The quite substantial increase in the rate of data acquisition time will quite generally speed up any application in which an analytical measurement such as continuous wave magnetic resonance is utilized as a diagnostic tool in applied research. For example, consider a research and development project in which specific performance limiting defects are identified in a semiconductor device technology. A production manager, made aware of the specific performance limiting defects may alter processing chemistry to ameliorate or eliminate problems caused by the defects. Because our method provides a much more rapid means of acquiring data, the process involved in the development of an improved processing approach is quite significantly faster, saving the organization involved significant research and development costs.

Although we have described certain present preferred embodiments of our method of signal processing of signals containing repeatable measurements to remove noise, it should be distinctly understood that the invention is not limited thereto but may be variously embodied within the scope of the following claims.

We claim:

1. A method of signal processing for repetitively acquired noisy signals obtained by magnetic resonance or other analytical measurements involving a deterministic signal obscured by noise in order to obtain enhanced physical, chemical or biological information from the noisy signals due to improved signal to noise ratio comprising:

using a single measurement device in order to acquire repeated measurements and generate a first set of signals, each signal corresponding to one of the measurements and each signal of the first set of signals having a constant noise variance;

providing a signal processing device having a processor and a non-transitory computer readable memory containing an adaptive algorithm which utilizes a reference signal in order to generate a filtered signal;

using the signal processing device in order to perform the following steps:

a) conventionally averaging at least two noisy signals from the first set of signals in order to generate an initial reference;

b) executing the adaptive algorithm using the initial reference in step (a) in order to filter a subsequent noisy signal from the first set of signals in order to obtain a filtered signal;

c) conventionally averaging the subsequent noisy signal with the initial reference in order to update the initial reference;

d) executing the algorithm using the updated reference in order to filter a next subsequent noisy signal in order to obtain another filtered signal;

e) conventionally averaging the next subsequent noisy signal with the updated reference in order to further update the reference;

f) repeating steps (d) and (e) in order to obtain a set of filtered signals;

g) averaging the set of filtered signals in order to generate a final signal that has a noise variance equal to a prediction error variance of the adaptive filter divided by a number of signals used in steps (b) through (f), in order to create a measure that is lower than the noise variance in any of the signals corresponding to the measurements as well as the noise variance for the average of these measurements;

h) identifying the physical, chemical or biological information from the final filtered signal that has been, or is, enhanced because the information is no longer being obscured by noise; and i) providing the identified and enhanced information as the output of the signal processing device.

2. The method of claim 1 wherein the set of signals is comprised of continuous wave magnetic resonance measurements.

3. The method of claim 1 wherein the repeated measurements are made of an object having point defects and the final filtered signal provides an enhanced and a more definitive identification of chemical and physical nature of the point defects that are present in the object.

4. The method of claim 1 wherein the signal processing device is a desktop computer or a laptop computer containing the processor that executes the algorithm which is stored on the non-transitory computer readable memory.

5. The method of claim 1 wherein the algorithm is an exponentially weighted recursive least squares algorithm.

6. The method of claim 1 wherein the repeated measurements are made of an object containing at least one of inorganic substances and organic substances and the final filtered signal provides an enhanced and a more definitive identification of chemical and physical nature of at least one of organic substances and inorganic substances that is present in the object.

7. The method of claim 1 wherein the repeated measurements are made of a biological material and the final filtered signal provides an enhanced and a more definitive identification of chemical and physical nature of the biological material.

8. The method of claim 1 wherein the repeated measurements are made of an object and the final filtered signal identifies atomic scale structure in the object.

9. The method of claim 1 also comprising displaying the final filtered signal on a monitor.

10. The method of claim 1 wherein the object is a patient and the signals are magnetic resonance scans.

11. The method of claim 1 wherein the repeated measurements are made of an object having free radicals and the final filtered signal provides an enhanced and a more definitive identification of chemical and physical nature of the free radicals that are present in the object.

12. A method of processing a signal obtained by magnetic resonance or other analytical measurement of an object which signal is repetitive and buried in noise so that the signal and some physical, chemical or biological condition of the object represented by the repetitive signal and buried in noise is identifiable comprising:

using a single measurement device in order to repeat a desired measurement of the object and generate a first set of signals, each signal corresponding to one of the measurements and each one of the signals having a noise variance;

providing a signal processing device having a processor and a non-transitory computer readable memory containing an algorithm which applies a reference to a signal in order to generate a filtered signal, the signal processing device:

a) creating the reference by combining at least two of the signals, in the first set of signals together;

b) executing the contained algorithm in order to filter one of the signals in the first set of signals in order to obtain a filtered signal;

c) updating the reference in real time;

d) applying the contained algorithm in order to filter yet another one of the signals in the first set of signals using the updated reference in order to obtain another filtered signal;

e) repeating steps (c) and (d), a plurality of times in order to obtain a set of resulting filtered signals, in which the set of resulting filtered signals themselves reveal, either the repetitive signal obtained by magnetic resonance, or the repetitive analytical measurement signal of the object, that was previously buried in noise, as an identifiable signal;

f) using at least one of the filtered signals, from the set of resulting filtered signals, in order to identify a physical, chemical or biological condition of the object represented by the filtered signal; and     g) providing the identified condition as the output of the signal processing device.

* * * * *